United States Patent
Göckler

[11] Patent Number: 5,177,700
[45] Date of Patent: Jan. 5, 1993

[54] NON-RECURSIVE HALF-BAND FILTER
[75] Inventor: Heinz Göckler, Backnang, Fed. Rep. of Germany
[73] Assignee: ANT Nachrichtentechnik GmbH, Backnang, Fed. Rep. of Germany
[21] Appl. No.: 814,265
[22] PCT Filed: Dec. 24, 1987
[86] PCT No.: PCT/DE87/00607
§ 371 Date: Aug. 18, 1989
§ 102(e) Date: Aug. 18, 1989
[87] PCT Pub. No.: WO88/06380
PCT Pub. Date: Aug. 25, 1988

Related U.S. Application Data
[63] Continuation of Ser. No. 408,493, Aug. 18, 1989, abandoned.

Foreign Application Priority Data
Feb. 19, 1987 [DE] Fed. Rep. of Germany ....... 3705207

[51] Int. Cl.⁵ .............................................. G06F 15/31
[52] U.S. Cl. ................ 364/724.1; 364/724.13; 364/724.16
[58] Field of Search ............ 364/724.1, 724.13, 724.16

[56] References Cited
U.S. PATENT DOCUMENTS

| | | | |
|---|---|---|---|
| 4,344,149 | 8/1982 | Meeberg et al. | 364/724.1 |
| 4,612,625 | 9/1986 | Bertrand | 364/724.1 |
| 4,766,562 | 8/1988 | Vary | 364/724.1 |
| 4,825,396 | 4/1989 | Gazsi | 364/724.15 |
| 4,852,035 | 7/1989 | Michener | 364/724.1 |
| 4,893,264 | 1/1990 | Noll et al. | 364/724.16 |
| 4,896,320 | 1/1990 | Göckler | 364/724.1 |

OTHER PUBLICATIONS
Bellanger et al, "Interpolation, Extrapolation, and Reduction of Computation Speed in Digital Filters" *IEEE Trans. on Acoustics, Speech & Signal Processing* vol. AS-SP-22, No. 4 Aug. 1974 pp. 231–235.

Ansari, "Elliptic Filter Design for a Class of Generalized Halfband Filters", *IEEE Trans. on Acoustics, Speech & Signal Processing* vol. ASSP-33 No. 4 Oct. 1985 pp. 1146–1150.

*Primary Examiner*—David H. Malzahn
*Attorney, Agent, or Firm*—Spencer, Frank & Schneider

[57] ABSTRACT

A non-recursive half-band filter having a filter length N and complex coefficients for receiving either a real input signal s(kT) or a complex input signal s(2kT) and for processing and converting the received input signals into either a complex output signal s(2kT) or a real output signal s(kT) wherein the complex coefficients operate at a function of h(l) where $l = -(N-1)/2$ to $(N-1)/2$ to $(N-1)/2$ and the filter length N is odd. As a result it is possible to convert a real input signal into a complex output signal, by modulating its pulse response to a complex carrier of the frequency equal to ¼ or ¾ of the sampling frequency, where the null phase of this frequency is an integer multiple of $\pi/2$. It is also possible to convert a complex input signal into a real output signal, by modulating its pulse frequency to the complex carrier of a frequency signal to the input sampling frequency or half thereof, where the null phase of this frequency is an integer multiple of $\pi/2$.

14 Claims, 6 Drawing Sheets

NON-RECURSIVE HALF-BAND FILTER

This application is a continuation of application Ser. No. 07/408,493, filed Aug. 18, 1989, now abandoned.

BACKGROUND OF THE INVENTION

The invention relates to a non-recursive half-band filter. Such filters have become known from the paper by Bellanger et al, entitled, "Interpolation, Extrapolation, and Reduction of Computation Speed in Digital Filters," published in *IEEE Transactions on Acoustics, Speech and Signal Processing*, Vol. ASSP-22, No. 4, August, 1974, pages 231-235.

The known half-band filters process real input signals into real output signals.

SUMMARY OF THE INVENTION

It is an object of the present invention to provide a non-recursive half-band filter that makes it possible to convert a real input signal into a complex output signal, or vice versa, in an inexpensive manner.

The above object is achieved according to a first aspect of the invention by a non-recursive half-band filter with complex coefficients for processing a real input signal $s(kT)$ by having the sampling frequency $fA = 1/T$ and for converting this real input signal $s(kT)$ into a complex output signal $s(2kT)$, wherein the filter complex coefficients $h(l)$, where $l = -(N-1)/2$ to $(N-1)/2$ and the filter length N is odd, have alternating purely real and purely imaginary values, and therefore no complex values in the fullest sense, and wherein the pulse response of a half-band filter $h(l)$ having exclusively real values and the characteristics $h(l) = h(-l)$ for all $|l| \leq (N-1)/2$ and $h(l) = 0$ for $l = \pm 2, \pm 4, \ldots$, is modulated onto the complex carrier of a frequency of $\pm\frac{1}{4}$ of the input sampling frequency $fA = 1/T$ to yield $$h(l) = h(l) \cdot e^{j(\pm 2\pi lfA/4fA + \phi 0)} = j^{\pm l} \cdot e^{j\phi 0} \cdot h(l)$$

and the null phase $\phi 0$ of this complex carrier is an integer multiple m of $\pi/2$ ($\phi 0 = m \cdot \pi/2$ where $m = 0, 1, 2, 3, \ldots$).

The above object is achieved according to another aspect of the invention by a non-recursive half-band filter with complex coefficients for processing a complex input signal $s(2kT)$ and for doubling the sampling frequency $fA' = 1/2T$ to $fA = 2fA'$ and for converting this complex input signal $s(2kT)$ into a real output signal $s(kT)$, and wherein the filter complex coefficients $h(l)$, where $l = -(N-1)/2$ to $(N-1)/2$ and the filter length N is odd, alternatingly have purely real and purely imaginary values, and therefore no complex values in the fullest sense, and the pulse response of a half-band filter $h(l)$ having exclusively real values and the characteristics $h(l) = h(l)$ for all $|l| \leq (N-1)/2$ and $h(l) = 0$ for $l = \pm 2, \pm 4, \ldots$, is modulated onto the complex carrier of a frequency of $\pm\frac{1}{4}$ of the output sampling frequency $fA = 1/T$ to yield $$h(l) = h(l) \cdot e^{j(\pm \pi lfA/4fA) + \phi 0)} = j^{\pm l} \cdot e^{j\phi 0} \cdot h(l)$$

and the null phase $\phi 0$ of this complex carrier is an integer multiple m of $\pi/2$ ($\phi 0 = m \cdot \pi/2$ where $m = 0, 1, 2, 3, \ldots$).

The above object is achieved according to still a further object of the invention by a non-recursive half-band filter, which converts a real input signal $s(kT)$ into a complex output signal $s(kT)$ where k is a running index, while maintaining the sampling frequency $fA = 1/T$, in that the filter pulse response $h(l)$, where $l = -(N-1)/2$ to $(N-1)/2$ and N is an odd filter length, is modulated onto a complex carrier at a frequency of $\pm\frac{1}{4}$ of the sampling frequency $fA = 1/T$, to yield $$h(l) = h(l) \cdot e^{j(\pm 2\pi lfA/4fA + \phi 0)} = j^{\pm l} \cdot e^{j\phi 0} \cdot h(l)$$

and the null phase $\phi 0$ of this frequency is an integer multiple m of $\pi/2$ ($\phi 0 = m \cdot \pi/2$ where $m = 0, 1, 2, 3, \ldots$).

The above object is achieved according to still a further aspect of the invention by a non-recursive half-band filter, which converts a complex input signal $s(kT)$ where k is a running index into a real output signal $s(kT)$, while maintaining the sampling frequency $fA = 1/T$, in that the filter pulse response $h(l)$ with reference to the sampling frequency $fA$, where $l = -(N-1)/2$ to $(N-1)/2$ and the filter length N is odd, is modulated onto the complex carrier at a frequency of $\pm fA/4$ to yield $$h(l) = h(l) \cdot e^{j(\pm 2\pi lfA/4fA + \phi 0)} = j^{\pm l} \cdot e^{j\phi 0} \cdot h(l)$$

and the null phase 0 of this frequency is an integer multiple m of $\pi/2$ ($\phi 0 = m \cdot \pi/2$ where $m = 0, 1, 2, 3, \ldots$).

The novel non-recursive half-band filter according to each of the first two aspects of the invention permits the conversion of real digital input signals into complex digital output signals with a simultaneous reduction of the sampling frequency by a factor of two, and the conversion of complex digital input signal into real digital output signals with a simultaneous increase in the sampling frequency by a factor of 2. The novel non-recursive half-band filter according to the latter two aspects of the invention permits the conversion of real digital input signals into complex digital output signals while maintaining the sampling frequency, and the conversion of complex digital input signals into real digital output signals, likewise while maintaining the sampling frequency.

These relatively inexpensive half-band filters are thus suitable as digital pre-filters or post-filters for digital systems employed to process complex signals and as digital partial filters in an arrangement of anti-aliasing filters for band limitation while complying with the sampling theorem. The advantage of the half-band filter lies in its linear phase and simultaneously its low cost. In each case, the smallest possible sampling frequency required on the basis of the sampling theorem can be employed.

BRIEF DESCRIPTION OF THE DRAWINGS

There now follows a description with reference to the drawing figures in which.

DESCRIPTION OF THE PREFERRED EMBODIMENT

Figure 1:
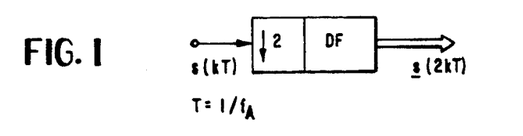
FIG. 1 is a block circuit diagram for the digital filter according to the invention.

In FIG. 1, the real input signal s(kT) is applied by halving the sampling rate to a digital half-band filter DF which generates therefrom the complex output signal s(2kT).

Figure 2A:
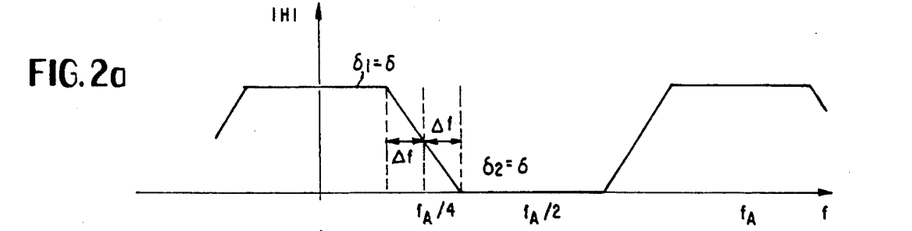
FIGS. 2a to 2c depict several amplitude responses of half-band filters plotted over frequency.

The amplitude frequency response of a prototype half-band filter is shown in FIG. 2a; the pass band of this filter extends from $-fA/4+\Delta f$ to $+fA/4-\Delta f$, and its stop band also has a width of $fA/2-2\Delta f$. It is a further characteristic of this half-band filter that the transition from the stop band to the pass band is steady and takes place over a width of $2\Delta f$. This transition range is symmetrical to $fA/4$. A further characteristic of the half-band filter is that its ripple in the pass band and in the stop band is identical, namely $\delta 1 = \delta 2 = \delta$. In such a filter, there results a pulse response h(l) where l=0 to N−1 and the filter length N is odd, and it follows that every second value is identical to zero, with the exception of the central main value (see FIG. 2, page 233, in the abovecited, paper by Bellanger et al).

Figure 2B:
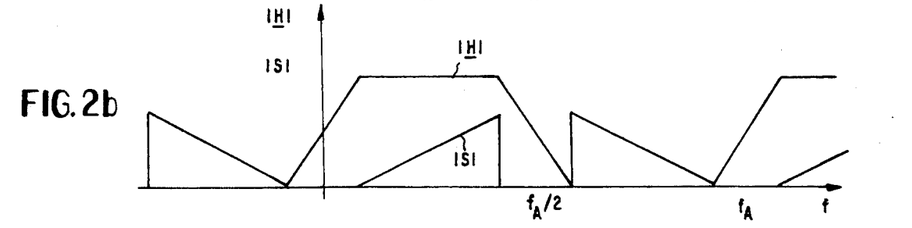

FIG. 2b shows the frequency response $|H|$. It can be seen that this frequency response has been shifted to the right by the frequency $fA/4$ relative to the frequency response of the prototype half-band filter. In addition, FIG. 2b shows that the spectrum $|S|$ of a real input signal s(kT) sampled at the sampling frequency fA has been inserted; because of sampling with fA, this input signal spectrum is periodically repeated in frequency ranges $[m\cdot fA, (m+\frac{1}{2})\cdot fA]$ in the normal position and in frequency ranges $[(m+\frac{1}{2})\cdot fA, (m+1)\cdot fA]$ in the inverted position where m=..., −1, 0, +1, ... The input signal s(kT), applied to the half-band filter according to the invention without any change in the sampling rate would thus suppress the inverted position between $fA/2$ and fA and of course all its repetitions and would simultaneously generate a complex signal s(kT). Halving the sampling rate now results in the desired spectra, with the normal position being repeated in each instance in a pattern of $fA/2=fA'$, where $fA'$ is the new sampling rate (see FIG. 2c).

At this point, it should be noted that a complex signal in the inverse position is obtained at the output of the half-band filter if the frequency response of the prototype half-band filter according to FIG. 2a is shifted by $-fA/4$ or, equivalently, by $+3fA/4$.

Figure 3:
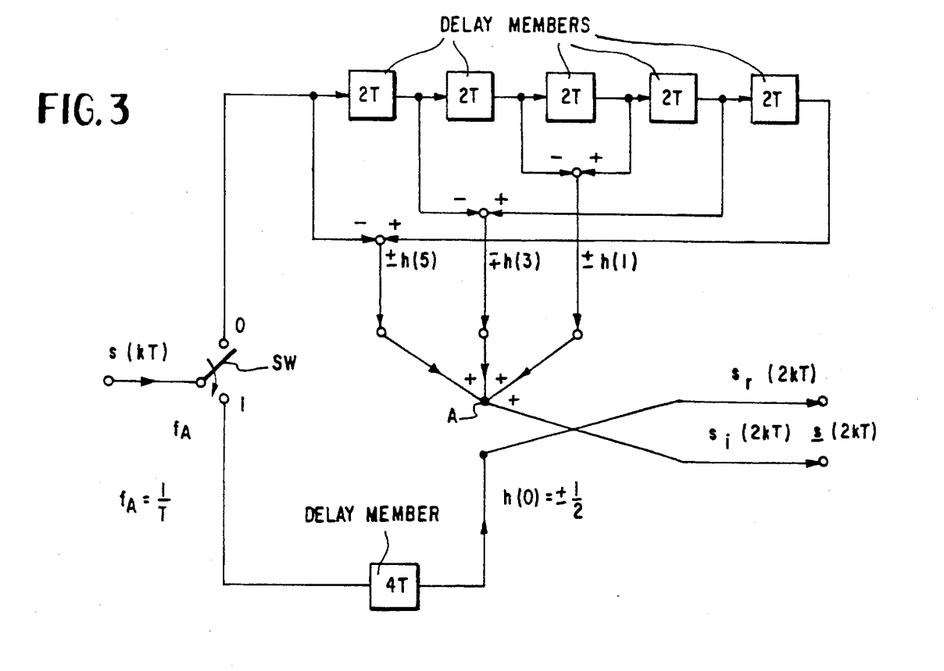
FIGS. 3 and 4 show particularly favorable circuit variations of the half-band filter.

FIG. 3 now shows a detailed embodiment of a half-band filter according to the invention.

Figure 2C:
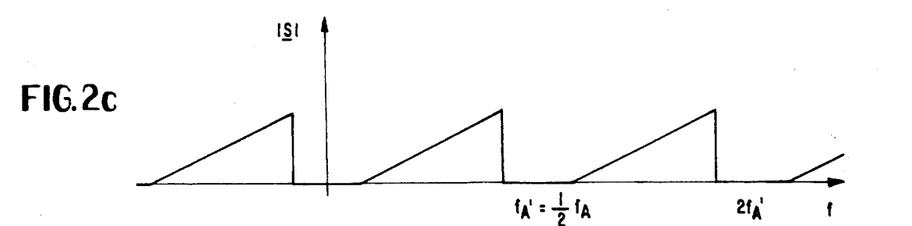

First, however, it should be noted, with reference to FIGS. 2a-c that the halving of the sampling rate is carried out only after filtering. This sequence for the procedure according to FIGS. 2a-c should be formally adhered to. However, according to the invention, the half-band filter can be divided into two branches, each of which is supplied from the start with every second sample of the input signal. However, this means nothing other than that the halving of the sampling rate can take place directly at the filter input, as shown schematically in the block circuit diagram of FIG. 1.

Figure 4:
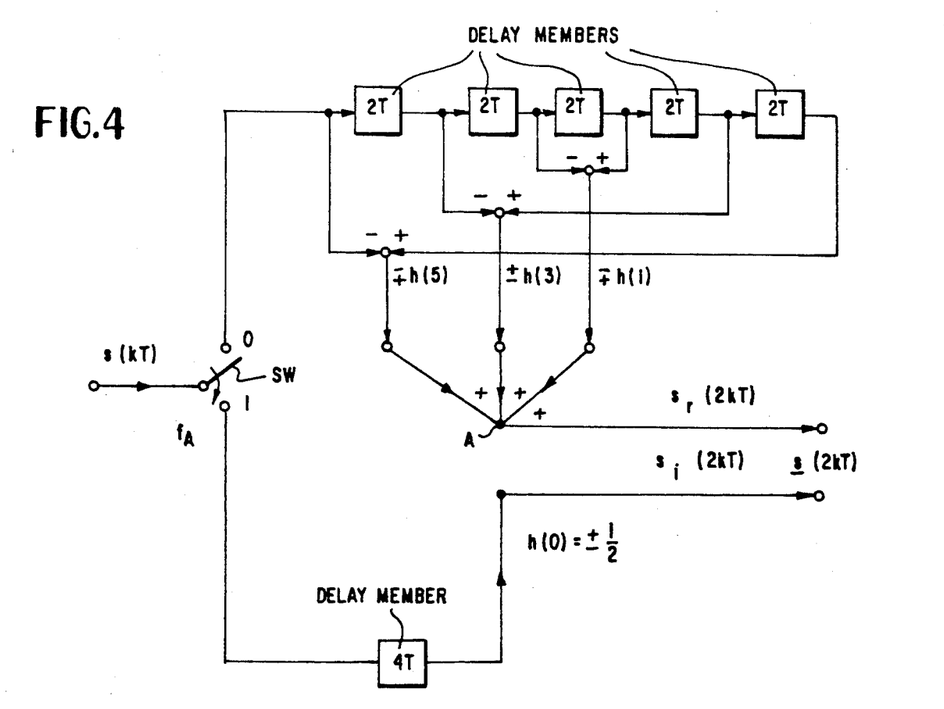

Accordingly, the detailed circuit embodiments of FIGS. 3 and 4 include an input-side demultiplexer switch Sw which supplies the input signal s(kT) to the upper branch and then to the lower branch, in each case at the rhythm of the sampling rate $fA'=fA/2$.

Both FIG. 3 and FIG. 4 show, as an example, a realization for a filter length of N=11. Accordingly, the lower branch incorporates a delay member 4T with a time delay of $(N-3)\cdot T/2=4T$, while the upper branch includes a chain of five delay members 2T with a time delay of 2T.

The circuit arrangement of FIG. 3 can be employed for two variations namely for a modulation phase angle $\phi 0=0$ and $\phi 0=\pi$ corresponding to m=0 and m=2. The output signal of the delay member of the lower branch is weighted (multiplied) with $h(0)=\frac{1}{2}$ and thus yields the real component $S_r(2kT)$ of the output signal. For m=2 weighting occurs with $-\frac{1}{2}$. The further processing of the upper branch now takes place in such a way that $(N+1)/4=3$ difference signals are formed:

the first difference signal equals the output signal of the first delay member minus the input signal of the last delay member;

the second difference signal equals the output signal of the second delay member minus the input signal of the penultimate delay member; and the third difference signal equals the output signal of the third delay member minus the input signal of the third last, i.e. the middle, delay member.

Next, these difference signals are weighted (multiplied) and summed by adder A and thereby yield the imaginary component of output signal s(2kT). The weighting is effected according to the following tables.

Examples for N=11 and h(−l)=h(l), where l=0, 1, ..., 5, corresponding to the prototype half-band filter according to the frequency response curve of FIG. 2a:

TABLE 1 m = 0 (for m = 2 in each case with the opposite sign for the complex coefficients h = Re(h) + jIm(h))

| l | −5 | −3 | −1 | 0 | 1 | 3 | 5 |
|---|---|---|---|---|---|---|---|
| Re(h) | 0 | 0 | 0 | h(0) | 0 | 0 | 0 |
| Im(h) | −h(5) | h(3) | −h(1) | 0 | h(1) | −h(3) | h(5) |

TABLE 2 m = 1 (for m = 3 in each case with the opposite sign for the complex coefficients)

| l | −5 | −3 | −1 | 0 | 1 | 3 | 5 |
|---|---|---|---|---|---|---|---|
| Re(h) | h(5) | −h(3) | h(1) | 0 | −h(1) | h(3) | −h(5) |
| Im(h) | 0 | 0 | 0 | h(0) | 0 | 0 | 0 |

The realization according to FIG. 4 takes place in the same manner as that in FIG. 3; the sole difference is in the other null phase value $\phi 0=m\cdot\pi/2$ where m=1 and 3, the only consequence of which is a different weighting and an exchange of filter branch outputs.

Figure 5:
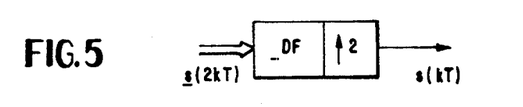
FIG. 5 is a block circuit diagram for a half-band filter used to process a complex input signal into a real output signal, according to the present invention.
Figure 6:
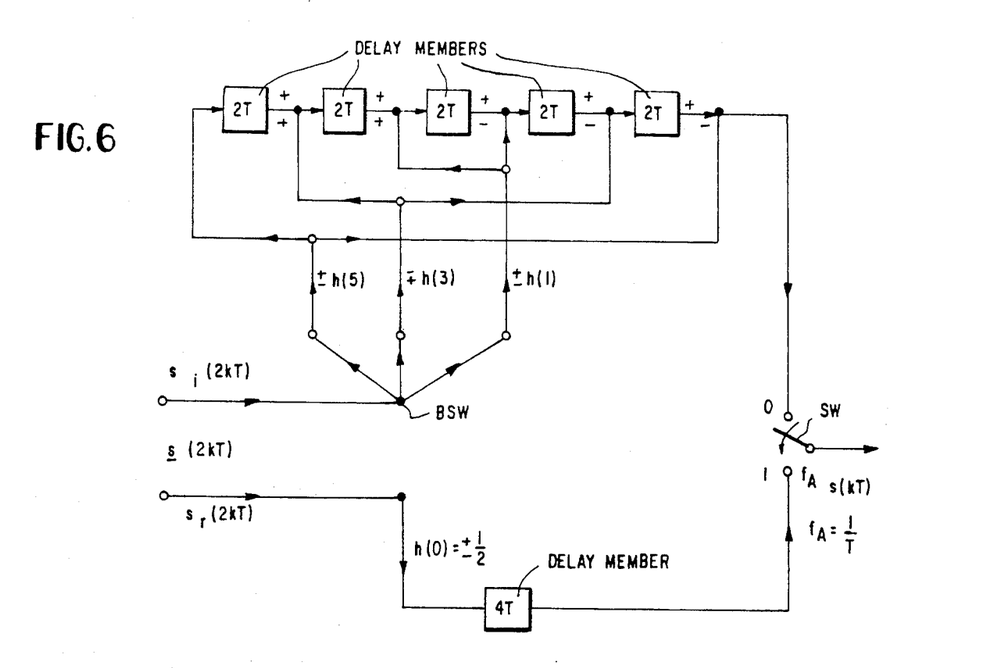
FIG. 6 shows, in schematic, circuit details of the filter shown in FIG. 5, with this circuit having been developed by transposition from that of FIG. 3, i.e., by reversing all directions indicated by arrows and replacing a branching switch for an adder and vice versa, and by replacing a demultiplexer with a multiplexer.
Figure 7:
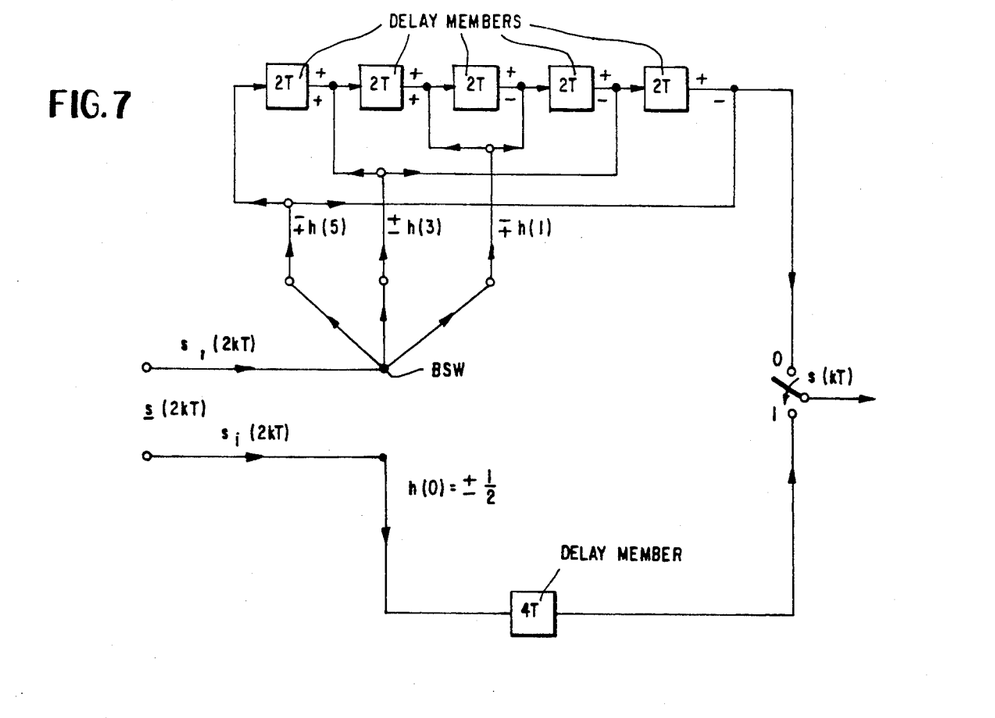
FIG. 7 shows, in schematic, another circuit arrangement of the filter shown in FIG. 5, this circuit arrangement being developed from that of FIG. 4 in a manner similar to that of FIG. 8.

FIG. 5 shows the block circuit diagram for the reversed use of the half-band filter of FIG. 1, namely for the generation of a real output signal from a complex input signal. To this end, there must be a transposition of the circuits presented above, which results in a reversal of the directions of all arrows and the replacement of a branching switch $BS_w$ for adder A and vice versa, as well as the replacement of a demultiplexer with a multiplexer. In a corresponding manner, the circuit embodiment of FIG. 6 is derived from FIG. 3 and the circuit of FIG. 7 is derived from FIG. 4. Thus, both FIGS. 6 and 7 show, as an example, a realization for a filter length N=11 where m=0 or 2 in FIG. 6, and m=1 or 3 in FIG. 7.

Figure 8:
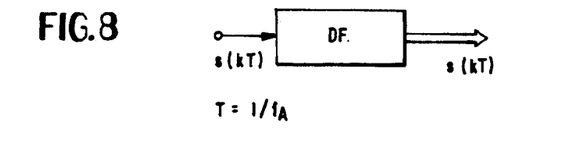
FIG. 8 is another embodiment of a block circuit diagram for the digital filter according to the invention.

In FIG. 8, the real input signal s(kT) is fed to digital half-band filter DF which generates therefrom the complex output signal s(kT).

Figure 9A:
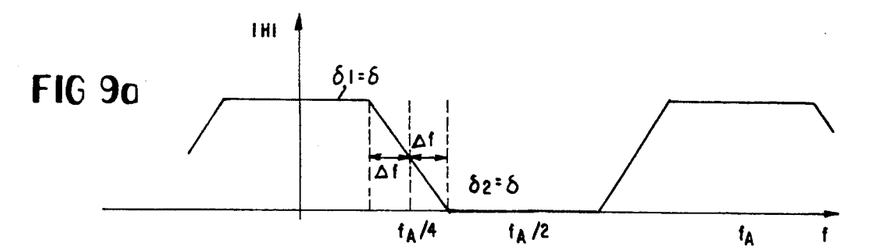
FIGS. 9a to 9c show several amplitude responses of half-band filters plotted over frequency.

FIG. 9a shows the amplitude frequency response of a prototype half-band filter; its pass band extends from $-fA/4 + \Delta f$ to $+fA/4 - \Delta f$ (half value) and its stop band also has a width of $fA/2 - 2\Delta f$. It is a further characteristic of the half-band filter that the transition from the stop band to the pass band is steady and takes place over a width of $2\Delta f$. This transition region is symmetrical to $fA/4$. A further characteristic of the half-band filter is that its ripple is the same in the pass band as in the stop band, namely $\delta 1 = \delta 2 = \delta$. In such a filter, there results a pulse response h(l) where l=0 to N-1 and the filter length N is odd with the result that every second value is equal to zero, except for the central main value (see in this connection also FIG. 2 at page 233 of the above-cited paper by Bellanger et al).

Figure 9B:
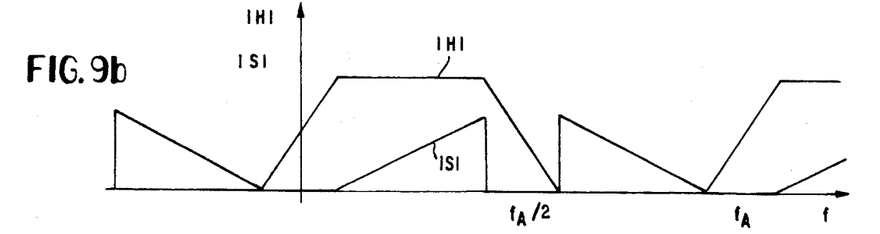
Figure 9C:
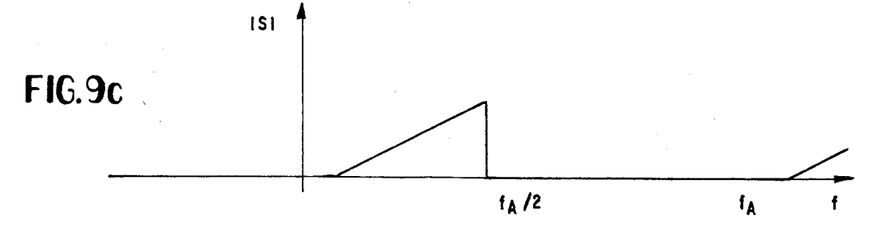

FIG. 9b shows the frequency response $|H|$. It can be seen that this frequency response is shifted to the right by the frequency $fA/4$ relative to the frequency response of the prototype half-band filter. FIG. 9b additionally shows the spectrum $|S|$ of a real input signal s(kT) sampled at sampling frequency fA. Due to the sampling at fA, this signal is periodically repeated in frequency ranges [m·fA, (m+½)·fA] in the normal position and in frequency ranges [(m+½)·fA, (m+1)·fA] in the inverse position where m=..., -1, 0 +1,... Thus the inverse position of real input signal s(kT), applied to the half-band filter according to the invention without a change in sampling rate, and of course all of its repetitions are suppressed between fA/2 and fA and at the same time a complex signal s(kT) is generated, (see FIG. 9c).

At this point it should be mentioned that a complex signal in the inverse position is obtained at the output of the half-band filter if the frequency response of the prototype half-band filter of FIG. 9a is shifted by $-fA/4$ or, the equivalent, by $+3fA/4$.

Figure 10:
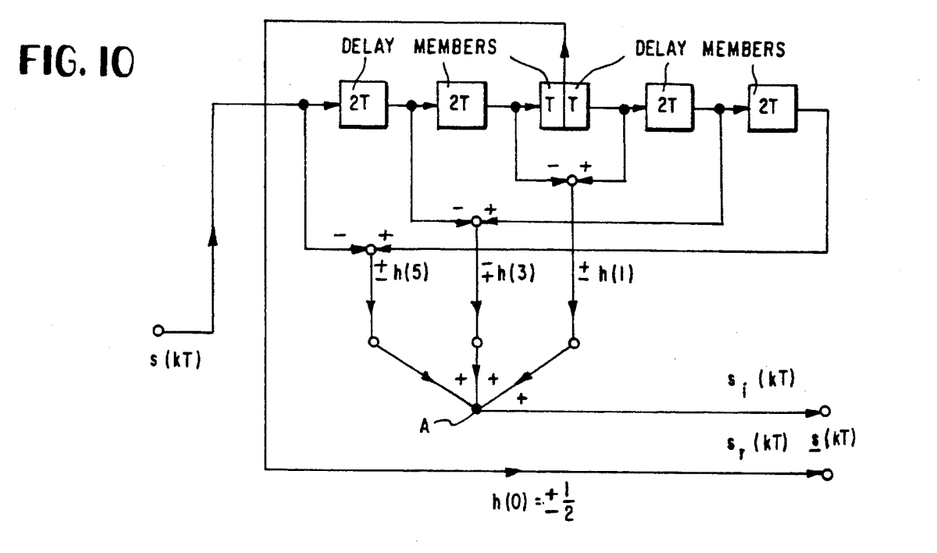
FIGS. 10 and 11 show particularly favorable circuit variations of the half-band filter.

FIG. 10 now shows a detailed embodiment of a half-band filter according to the invention.

Figure 14:
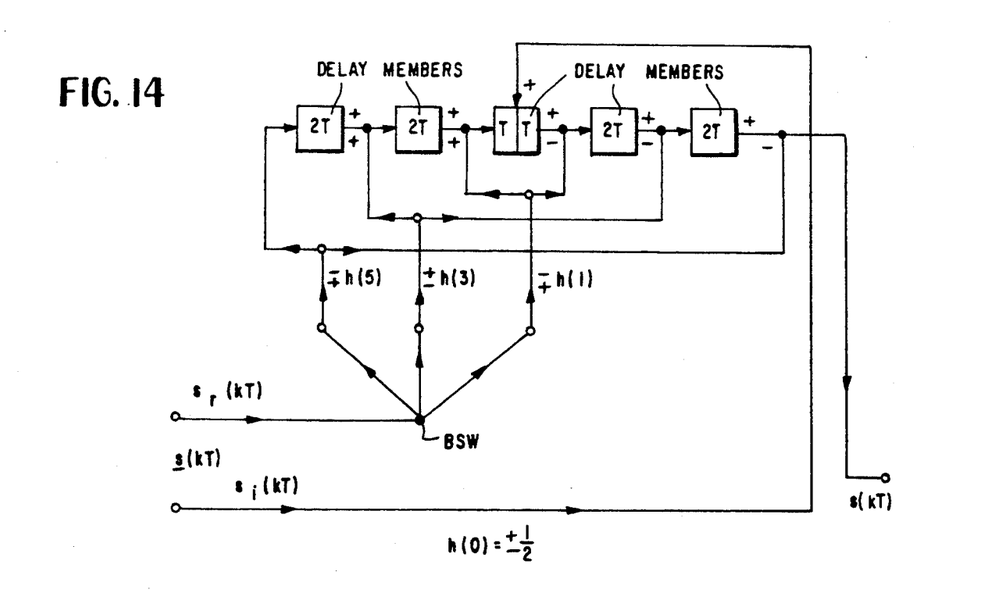

FIG. 10 as well as FIG. 14 shows exemplary realizations for a filter length N=11 including a chain of six delay members (2T, T), four of which having a delay time of 2T and two, which are disposed symmetrically between the other four delay members, a delay time of T.

The circuit of FIG. 10 can be employed for two realizations of the invention, namely for a modulation phase angle $\phi 0 = 0$ and $\phi 0 = \pi$, corresponding to m =0 and m=2. The output signal of the delay members of the left half of the chain is weighted (multiplied) with h(0)=½ and thus provides the real component $s_r(kT)$ of the output signal. For m=2, weighting occurs with -½. The further processing in the delay chain now takes place in such a way that (N+1)/4=3 difference signals are formed:

the first difference signal is equal to the input signal of the first delay member minus the output signal of the last delay member;

the second difference signal is equal to the input signal of the second delay member minus the output signal of the penultimate delay member; and the third difference signal is equal to the input signal of the third delay member minus the output signal of the third last, i.e. the middle, delay member on the right.

Next, these difference signals are weighted (multiplied) and summed by an adder A and thereby yield the imaginary component of output signal s(kT) The weighting is effected according to the following tables.

Examples for N=11 and h(-l)=h(l), where l=0, 1, ... 5, corresponding to the prototype half-band filter according to the frequency response curve of FIG. 2a:

TABLE 11

| m = 0 (for m = 2 in each case with the opposite sign for the complex coefficients h = Re(h) + jIm(h)) | | | | | | | |
|---|---|---|---|---|---|---|---|
| l | −5 | −3 | −1 | 0 | 1 | 3 | 5 |
| Re(h) | 0 | 0 | 0 | h(0) | 0 | 0 | 0 |
| Jm(h) | −h(5) | h(3) | −h(1) | 0 | h(1) | −h(3) | h(5) |

TABLE 12

| m = 1 (for m = 3 in each case with the opposite sign for the complex coefficients) | | | | | | | |
|---|---|---|---|---|---|---|---|
| l | −5 | −3 | −1 | 0 | 1 | 3 | 5 |
| Re(h) | h(5) | −h(3) | h(1) | 0 | −h(1) | h(3) | −h(5) |
| Jm(h) | 0 | 0 | 0 | h(0) | 0 | 0 | 0 |

Figure 11:
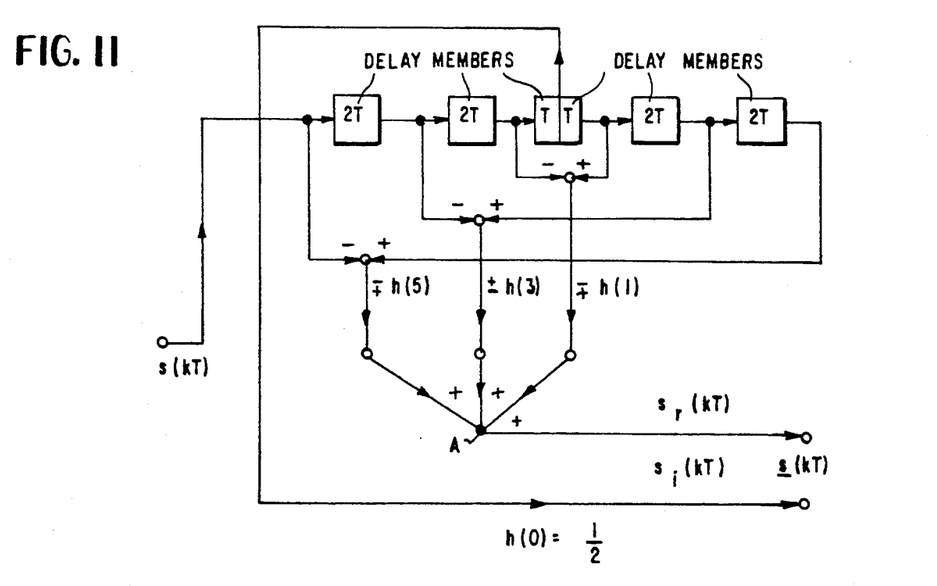

The realization according to FIG. 11 takes place in the same manner as that in FIG. 10; the sole difference is in the other null phase value $\phi 0 = m \cdot \pi / 2$ where m = 1 and 3, the only consequence of which is a different weighting.

Figure 12:
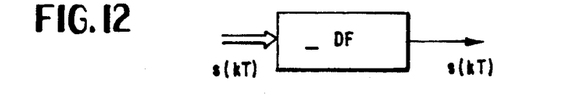
FIG. 12 is a block circuit diagram of a transposed, inversely operated half-band filter for processing a complex input signal into a real output signal.
Figure 13:
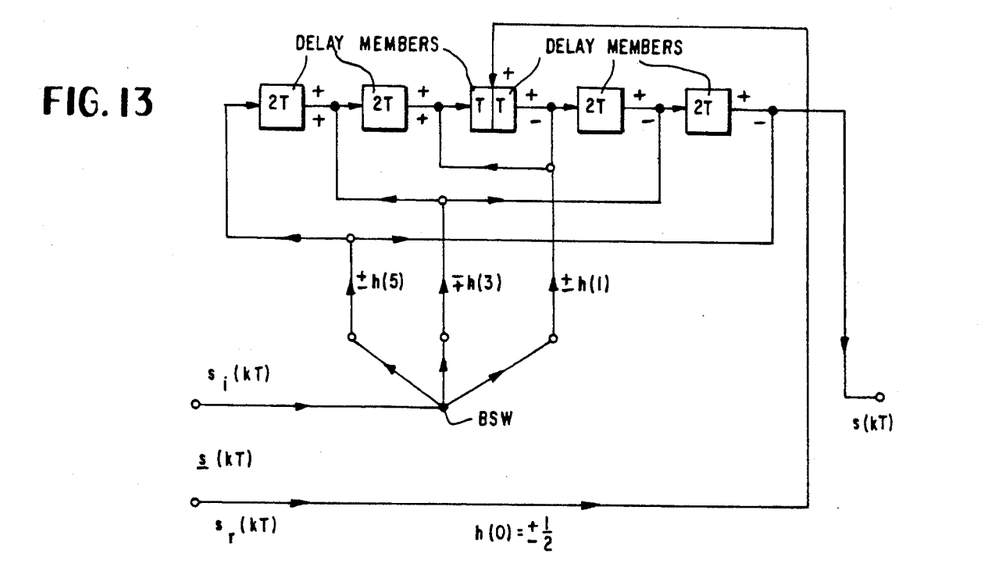
FIGS. 13 and 14 respectively show, in schematic, circuit details of the filter according to FIG. 12, with the circuits being respectively developed by transposition from FIGS. 10 and 11, i.e. by reversal of all directions indicated by arrows and the replacement of a branching switch with an adder and vice versa.

FIG. 12 shows the block circuit diagram for the reversed use of the half-band filter of FIG. 8, namely for the generation of a real output signal from a complex input signal. For this purpose, there must be a transposition of the circuits presented above, which results in a reversal of the directions of all arrows and the replacement of a branching switch $BS_w$ adder A and vice versa. In a corresponding manner, the circuit embodiment of FIG. 13 is derived from FIG. 10 and the circuit of FIG. 14 is derived from FIG. 11. Accordingly, both FIGS. 13 and 14 show a realization for a filter length N=11 where m=0 or 2 in FIG. 13, and m=1 or 3 in FIG. 14.

I claim:

1. A non-recursive half-band filter having a filter length N for processing a real input signal s(kT) and converting the real input signal into a complex output signal s(2kT), said half-band filter comprising:

input means for receiving samples of a real input signal s(kT) at a sampling frequency fA, where fA = 1/T, and for providing samples at one-half of the sampling frequency fA; and means, responsive to the provided samples, for processing and converting the real input signal into a complex output signal s(2kT), said means having complex coefficients h(l), where l= −(N−1)/2 to (N−1)/2 and the filter length N is odd, with alternating purely real and purely imaginary values, said processing and converting means including means for modulating the pulse response of a half-band filter h(l) with exclusively real values and h(l) =h(−1) for all |l|≤(N−1)/2 and h(l)=0 for l=±2, ±4, ..., onto a complex carrier of a frequency of ±1/4 of the input sampling frequency to yield $$h(l) = h(l) \cdot e^{j(\pm 2\pi l f_A/4 f_A + \phi 0)} = j^{\pm l} \cdot e^{j\phi 0} \cdot h(l),$$

wherein the null phase φ0 of the complex carrier is an integer multiple m of π/2 (φ0=m·π/2 where m=0, 1, 2, 3 ...), and wherein said modulating means is divided into a first branch and a second branch, said first branch comprising a chain of (N−1)/2 delay members each have a delay time of 2T, means for forming a plurality of difference signals and means for weighting said difference signals, with every second sample of the input signal s(kT) being routed into the chain of (N−1)/2 delay members; said difference signal forming means subtracting from the output signal of the last delay member in the chain the input signal of the first delay member of the chain to form a first difference signal, subtracting from the output signal of the penultimate delay member in the chain the input signal of the second delay member of the chain to form a second difference signal, subtracting from the output signal of the third to last delay member in the chain the input signal of the third delay member of the chain to form a third difference signal, and so on until the outputs of each delay member are processed; said weighting means including an adder and weighting the respective said difference signals by a function of h(l) of the pulse response and summing the weighted signals via the adder to yield either the real or the imaginary component of the filter output signal s(2kT); said second branch including a second branch delay member which has a time delay of T·(N−3)/2, into which is routed every other sample of the input signal, the output signal of said second branch delay member being weighted with a value equal to a function of h(0) to yield the other of the imaginary component and the real component of the filter output signal s(2kT).

2. A non-recursive half-band filter according to claim 1, where N=11 and m=1, and said weighting means weights the first difference signal with a value equal to the function −h(5), the second difference signal with a value equal to the function h(3) and the third difference signal a value equal to the function −h(1); and the sum of the difference signals yields the real component s_r(2kT) of the filter output signal while the signal weighted with the function h(0)=½ yields the imaginary component s_i(2kT) of the filter output signal.

3. A non-reactive half-band filter according to claim 1, where N=11 and m=3, and said weighting means weights the first difference signal with a value equal to the function h(5), the second difference signal with a value equal to the function −h(3), and the third difference signal with a value equal to the function h(1); and the sum of the difference signals yields the real component s_r(2kT) while the signal weighted with the function h(0)=−½ yields the imaginary component s_i(2kT) of the filter output signal.

4. A non-recursive half-band filter according to claim 1, wherein N=11 and m=0, and said weighting means weights the first difference signal with a value equal to the function h(5), the second difference with a value equal to the function −h(3), and the third difference signal with a value equal to the function h(1); and the sum of the difference signals yields the imaginary component s_i(2kT) of the filter output signal while the signal weighted with the function h(0)=½ yields the real component s_r(2kT) of the filter output signal.

5. A non-recursive half-band filter according to claim 1, where N=11 m=2, and said weighting means weights the first difference signal with a value equal to the function −h(5), the second difference signal with a value equal to the function h(3), and the third difference signal with a value equal to the function −h(1); and the sum of the difference signals yields the imaginary component s_i(2kT) while the signal weighted with the function h(0)=½ yields the real component s_r(2kT) of the filter output signal.

6. A non-recursive half-band filter having a filter length N for processing a complex input signal s(2kT) and for converting the complex input signal for into a real output signal s(kT) at double the input sampling frequency, said half-band filter comprising:

input means for receiving samples of a complex input signal s(2kT) at a sampling frequency fA'=½T; means for processing and converting the received complex input signal into a real output signal s(kT) at an output sampling frequency fA=2fA' said means having complex coefficients h(l), where l=−(N−1)/2 to (N−1)/2 and the filter length N is odd, with alternating purely real and purely imaginary values, said processing and converting means including means for modulating the pulse response of a half-band filter h(l) with exclusively real values and h(l)=h(−1) for all |l|≤(N−1)/2 and h(l)=0 for l=±2, ±4, ..., onto a complex carrier of a frequency of ±¼ of the output sampling frequency fA=2fA' to yield $$h(l) = h(l) \cdot e^{j(\pm 2\pi l f_A/4 f_A + \phi 0)} = j^{\pm l} \cdot e^{j\phi 0} \cdot h(l),$$

with the null phase φ0 of the complex carrier being an integer multiple m of π/2 (φ0=m·π/2 where m=0, 1, 2, 3, ...); and wherein said complex input signal includes a real component and an imaginary component, and said processing and converting means is divided into first and second branches, said first branch comprising a chain (N−1)/2 delay members each having a time delay of 2T, means for weighting said real and imaginary components of the complex input signal and means for forming a plurality of difference signals, the weighting means weights the real component s_r(2kT) with a value equal to a function of h(l) of the pulses response and said forming means feeds the weighted component to the first delay member of the chain of delay members and subtracts the weighted component from the output signal of the last delay member of the chain to produce a difference signal, said difference signal furnishing every second sample of the real filter output signal s(kT); said weighting means weights additional momentary values of the real component s_r(2kT) of the filter input signal with a value equal to other functions of h(l) of the pulse response and said forming means adds these additional weighted values to a transversal signal of the chain of delay members at further points; and said second branch has a further delay member with a time delay of T·(N−3)/2 whose input receives the imaginary component s_i(2kT) of the complex input signal which has been weighted with a value equal to a function of h(0) and whose output yields every second time-shifted sample of the real filter output signal s(kT).

7. A non-reactive half-band filter according to claim 6, where m=0 and N=11, and the weighting means weights the additional momentary values of the real component $s_r(2kT)$ of the filter input signal and the forming means adds the weighted values to the transversal signal to the points of the chain as follows:

at the input of the first delay member of the chain, the real component is weighted with a value equal to the function h(5);

at the input of the second delay member of the chain, the real component is weighted with a value equal to the function −h(3);

at the input of the third delay member of the chain, the real component to weighted with a value equal to the function h(1);

at the input of the fifth delay member of the chain, the real component is weighted with a value equal to the function h(3); and at the output of the fifth delay member of the chain, the real component is weighted with a value equal to the function −h(5); where h(0)=½.

8. A non-recursive half-band filter having a pulse response h(l), where l=−(N−1)/2 to (N−1)/2 and N is an odd filter length, said filter comprising means for receiving a real input signal s(kT) and means for converting the real input signal s(kT) into a complex output signal s(kT), where k is a running index, while maintaining a sampling frequency fA=1T, said converting means modulating the pulse response h(l) onto a complex carrier with a frequency of ±¼ of the sampling frequency fA=1/T, to yield $$h(l)=h(l)\cdot e^{j(\pm 2\pi l f_A/4 f_A + \phi 0)} = j^{\pm l}\cdot e^{j\phi 0}\cdot h(l),$$

with the null phase φ 0 of this frequency being an integer multiple m of π/2 (φ0=m·π/2 where m=1, 2, 3, . . .), and wherein said converting means includes a chain of (N−1)/2 delay members having a center delay member, means for forming a plurality of difference signals and means for weighting the formed difference signals, where each sample of the input signal s(kT) is routed into the chain of (N−1)/2 delay members each having a delay time of 2T, and the center delay member is divided into two members each having a delay time of T; said difference signal forming means subtracting from the output signal of the last delay member of the chain the input signal of the first delay member of the chain to form a first difference signal, subtracting from the output signal of the penultimate delay member of the chain the input signal of the second delay member of the chain to form a second difference signal, subtracting from the output signal of the third to last delay member of the chain the input signal of the third delay member of the chain to form a third difference signal, and so on until the output signal of each delay member is processed; said weighting means includes an adder and weighting each said difference signal by a value equal to a respective function of h(l) of the pulse response and summing the weighted difference signals via the adder to yield either the real or the imaginary component of the filter output signal s(kT); said forming means forms a fourth difference signal from the center delay member of the chain where the input signal is delayed by a delay time T·(N−1)/2 and is weighted with a value equal to the function j(0), which results in the other of the imaginary component and the real component of the filter output signal s(kT).

9. A non-reactive half-band filter according to claim 8, where N=11 and m=1, and the weighted means weights the first difference signal with a value signal equal to the function −h(5), the second difference signal with a value equal to the function h(3) and third difference signal with a value equal to the function −h(1); and the sum of the difference signals yields the real component $s_r(kT)$ of the filter output signal while the signal weighted with the function of h(0)=½ yields the imaginary component $s_i(kT)$ of the filter output signal.

10. A non-recursive half-band filter according to claim 8, where N=11 and m=3, and the weighting means weights the first difference signal with a value equal to the function h(5), the second difference signal with a value equal to the function −h(3), the third difference signal with a value equal to the function h(1); and the sum of the difference signals yields the real component $s_r(kT)$ of the filter output signal while the signal weighted with the function of h(0)=½ yields the imaginary component $s_i(kT)$ of the filter output signal.

11. A non-reactive half-band filter according to claim 8, wherein N=11 m=0, and the weighting means weights the first difference signal with a value equal to the function h(5), the second difference signal with a value equal to the function −h(3), and the third difference signal with a value equal to the function h(1); and the sum of the difference signals yields the imaginary component $s_i(kT)$ of the filter output signal while the signal weighted with the function of h(0)=½ yields the real component $s_r(kT)$ of the filter output signal.

12. A non-recursive half-band filter according to claim 8, where N=11 and m=2, and the weighting means weights the first difference signal with a value equal to the function −h(5), the second difference signal with a value equal to the function h(3), the third difference signal with a value equal to the function −h(1); and the sum of the difference signals yields the imaginary component $s_i(kT)$ of the filter output signal while the signal weighted with the function h(0)=−½ yields the real component $s_r(kT)$ of the filter output signal.

13. A non-recursive half-band filter having a filter length N and a pulse response h(l) where l=−(N−1)/2 to (N−1)/2 and the filter length N is odd, said half-band filter comprising: means for receiving a complex input signal, and means for converting said complex input signal s(kT), where k is a running index, into a real output signal s(kT), while maintaining a sampling frequency fA=1/T, said converting means modulating the pulse response h(l) with reference to the sampling frequency fA, onto a complex carrier at a frequency of ±fA/4 to yield $$h(l)=h(l)\cdot e^{j(\pm 2\pi l f_A/4 f_A + \phi 0)} = j^{\pm l}\cdot e^{j\phi 0}\cdot h(l)$$

with the null phase φ 0 of this frequency being an integer multiples m of π/2 (φ0=m·π/2 where m=0, 1, 2, 3, . . .), and wherein said complex input signal has a real component and an imaginary component; and said converting means includes a chain of (N−1)/2 delay members each having a time delay of 2T and a center delay member divided into two members, with each divided member having a delay time of T, means for weighting the real and imaginary components with a value equal to a function of h(l), and means for forming a plurality of difference signals; and the weighting means weights the imaginary component $s_i(kT)$ with values equal to functions of $h(l)$ of the pulse response and said forming means feeds the weighted component to the first delay member of the chain and subtracts the weighted component from the output signal of the last delay member of the chain to form a difference signal, said difference signal furnishing the real filter output signal $s(kT)$; said weighting means weights additional momentary values of the imaginary component $s_i(kT)$ of the filter input signal with a value equal to other functions of $h(l)$ of the pulse response and said forming means adds the additional weighted values to a transversal signal of the chain of delay members at further points; and the weighting means further weights the real component $s_r(kT)$ of the complex filter input signal with the function $h(0)$, and additively feeds the weighted signal to the transversal signal of the chain at the center of said center delay member.

14. Non-recursive half-band filter according to claim 13, where $m=0$ and 2, respectively, and $N=11$, and the weighting means weights the additional momentary values of the real component $s_r(kT)$ and of the imaginary component $s_i(kT)$, respectively, of the filter input signal and the forming means adds the weighted values to the transversal signal to the points of the chain as follows:

- at the input of the first delay member of the chain, with a value equal to the function $\pm h(5)$;
- at the input of the second delay member of the chain with a value equal to the function $\pm h(3)$;
- at the input of the third delay member of the chain with a value equal to the function $\pm h(1)$;
- at the input of the penultimate delay member of the chain with a value equal to the function $\pm h(1)$;
- at the input of the last delay member of the chain with a value equal to the function $\pm h(3)$; and
- at the output of the last delay member of the chain with a value equal to the function $\pm h(5)$; where $h(0)=\pm\frac{1}{2}$.

* * * * *